(12) United States Patent
Ishida et al.

(10) Patent No.: US 9,702,929 B2
(45) Date of Patent: Jul. 11, 2017

(54) TEST APPARATUS

(71) Applicants: ADVANTEST CORPORATION, Tokyo (JP); The University of Tokyo, Tokyo (JP)

(72) Inventors: Masahiro Ishida, Tokyo (JP); Satoshi Komatsu, Tokyo (JP); Kunihiro Asada, Tokyo (JP); Toru Nakura, Tokyo (JP)

(73) Assignees: ADVANTEST CORPORATION, Tokyo (JP); THE UNIVERSITY OF TOKYO, Tokyo (JP)

( * ) Notice: Subject to any disclaimer, the term of this patent is extended or adjusted under 35 U.S.C. 154(b) by 614 days.

(21) Appl. No.: 14/044,635

(22) Filed: Oct. 2, 2013

(65) Prior Publication Data
US 2014/0091830 A1 Apr. 3, 2014

(30) Foreign Application Priority Data
Oct. 3, 2012 (JP) .................................. 2012-221620

(51) Int. Cl.
*G01R 31/02* (2006.01)
*G01R 31/28* (2006.01)
(Continued)

(52) U.S. Cl.
CPC ... *G01R 31/2851* (2013.01); *G01R 31/31721* (2013.01); *G11C 29/56008* (2013.01)

(58) Field of Classification Search
CPC H02M 2001/0009; G06F 13/385; G06F 1/26; G06F 1/3203; G06F 1/3246;
(Continued)

(56) References Cited

U.S. PATENT DOCUMENTS 5,721,879 A * 2/1998 Harada ..................... G06F 1/26
703/23
6,339,753 B1 * 1/2002 Nagatome ........... G06F 17/5022
703/14
(Continued)

FOREIGN PATENT DOCUMENTS

JP 10-293162 11/1998
JP 2007-205813 8/2007
(Continued)

OTHER PUBLICATIONS

Office action dated Sep. 30, 2014 from corresponding Korean Patent Application No. 10-2013-0117552 and its English summary provided by the applicant.
(Continued)

*Primary Examiner* — Vinh Nguyen
(74) *Attorney, Agent, or Firm* — Cantor Colburn LLP

(57) ABSTRACT

A judgment unit judges the pass/fail of DUTs. A power supply circuit has changeable characteristics, and supplies a power supply signal to the DUTs. A condition setting unit performs a pilot test before a main test for the DUTs, and acquires a test condition to be used in the main test. The condition setting unit executes: (a) measuring a first device characteristic value for each of multiple pilot samples sampled from among the DUTs while emulating a power supply characteristic close to what is used in a user environment in which the DUT is actually used; (b) measuring a predetermined second device characteristic value for each of the multiple pilot sample devices while emulating a power supply characteristic close to what is used in a tester environment in which the main test is performed; and (c) determining the test condition based on the first and second device characteristic values.

9 Claims, 9 Drawing Sheets

(51) Int. Cl.
  *G01R 31/317* (2006.01)
  *G11C 29/56* (2006.01)

(58) Field of Classification Search
  CPC .. G06F 1/3296; G06F 2217/78; G06F 11/261;
  G06F 17/5045; G06F 1/1684; G06F
  1/266; G06F 1/28; G06F 1/305; G06F
  21/81; G01R 31/31721; G01R 31/31924;
  G01R 31/3606; G01R 19/175; G01R
  19/2513; G01R 31/2846; G01R 31/2851;
  G01R 31/3004; G01R 31/318511; G01R
  31/3191; G01R 31/3631; G01R 31/40;
  G01R 31/42; G01M 15/044
  See application file for complete search history.

(56) References Cited

U.S. PATENT DOCUMENTS

| | | | |
|---|---|---|---|
| 6,868,375 B1 * | 3/2005 | Margulieux | G06F 11/261 703/21 |
| 6,937,965 B1 | 8/2005 | Bilak et al. | |
| 7,437,283 B2 * | 10/2008 | Shibayama | G06F 9/45537 703/28 |
| 8,127,157 B2 | 2/2012 | Bilak | |
| 2009/0182522 A1 | 7/2009 | Visweswariah et al. | |
| 2011/0181308 A1 * | 7/2011 | Ishida | G01R 31/31721 324/750.02 |
| 2011/0191055 A1 | 8/2011 | Martinez et al. | |
| 2012/0086462 A1 * | 4/2012 | Ishida | G01R 31/31721 324/601 |

FOREIGN PATENT DOCUMENTS

| | | |
|---|---|---|
| JP | 2009-147015 | 7/2009 |
| WO | 2010/029709 A1 | 3/2010 |

OTHER PUBLICATIONS

Japanese Notification of Reason(s) for Refusal corresponding to Application No. 2012-221620; Dispatch Date: May 31, 2016, with English translation.

* cited by examiner

TEST APPARATUS

CROSS-REFERENCE TO RELATED APPLICATION

This application claims priority from Japanese Patent Application No. 2012-221620, filed on Oct. 3, 2012, the disclosure of which is hereby incorporated by reference in its entirety.

BACKGROUND OF THE INVENTION

1. Field of the Invention

The present invention relates to a test apparatus configured to test a device under test.

2. Description of the Related Art

In a testing operation for a semiconductor integrated circuit (which will be referred to as the "DUT" hereafter) that employs CMOS (Complementary Metal Oxide Semiconductor) technology such as a CPU (Central Processing Unit), DSP (Digital Signal Processor), memory, or the like, electrical current flows in a flip-flop or a latch included in the DUT while it operates receiving the supply of a clock. When the clock is stopped, the circuit enters a static state in which the amount of current decreases. Accordingly, the sum total of the operating current (load current) of the DUT changes over time depending on the content of the test operation, and so forth. Also, various kinds of analog circuits and various kinds of analog/digital hybrid circuits also have a problem of such a fluctuation in the operating current.

A power supply circuit configured to supply electric power to such a DUT has a configuration employing a regulator, for example. Ideally, such a power supply circuit is capable of supplying constant electric power regardless of the load current. However, in actuality, such a power supply circuit has an output impedance that is not negligible. Furthermore, between the power supply circuit and the DUT, there is an impedance component that is not negligible. Accordingly, the power supply voltage fluctuates due to fluctuation in the load.

[Related Art Documents]
[Patent Documents]
[Patent Document 1]
    Japanese Patent Application Laid Open No. 2007-205813
[Patent Document 2]
    International Publication WO 2010/029709A1 pamphlet Typically, it is rare for the power supply performance (power integrity) of a power supply circuit mounted on a test apparatus to match that of a power supply circuit employed in an environment in which the DUT is actually operated, i.e., in an environment for a set on which the DUT is to be mounted (actual equipment environment or user environment). Accordingly, there is a difference in the waveform of the power supply voltage supplied to the DUT between the user environment and an environment used in the test (tester environment). This leads to a problem in that the quality (pass/fail) judgment result obtained in the tester environment does not match the quality judgment result obtained in the user environment. Such a problem will also be referred to as "divergence in the test results".

FIGS. 1A through 1C are diagrams for describing the divergence in the test results. In each of FIGS. 1A through 1C, the left-side diagram shows the power supply voltage waveform, and the right-side diagram shows a histogram. In the histogram, the horizontal axis represents a predetermined device characteristic of a semiconductor circuit. Examples of such a characteristic value include propagation delay. FIG. 1A shows the test result obtained in the user environment. FIG. 1B shows the test result obtained in a tester environment having a lower quality than that of the user environment. FIG. 1C shows the test result obtained in a tester environment having a higher quality than that of the user environment.

The limit value LMT in FIGS. 1A through 1C corresponds to a threshold value used in the quality judgment. In this case, the device characteristic values plotted on the left side of the limit value are each determined as "pass". On the other hand, the device characteristic values plotted on the right side of the limit value are each determined as "fail". However, as shown in FIG. 1B, in a case of performing the quality judgment in a tester environment having a lower quality than that of the user environment, DUTs to be judged as "pass" in the desired test are judged as "fail". This leads to yield loss (overkill).

Conversely, as shown in FIG. 1C, in a case of performing the quality judgment in a tester environment having a higher quality than that of the user environment, DUTs to be judged as "fail" in the desired test are judged as "pass". This leads to a problem of test escape (underkill).

SUMMARY OF THE INVENTION

The present invention has been made in order to solve such a problem. Accordingly, it is an exemplary purpose of an embodiment of the present invention to provide a test apparatus and test method configured to be capable of reducing divergence in the test results.

An embodiment of the present invention relates to a test apparatus configured to test a device under test. The test apparatus comprises: a judgment unit configured to judge a pass/fail of the device under test; a power supply circuit configured to allow a characteristic thereof to be changed, and to supply a power supply signal to the device under test; and a condition setting unit configured to perform a pilot test before a main test for the device under test, and to acquire a test condition to be used in the main test. The condition setting unit is configured to execute: (a) measuring a first device characteristic value for each of multiple pilot sample devices sampled from the devices under test in a state in which a characteristic of the power supply circuit is emulated such that it is close to a power supply characteristic in a user environment in which the device under test is actually used; (b) measuring a predetermined second device characteristic value for each of the multiple pilot sample devices in a state in which a characteristic of the power supply circuit is emulated such that it is close to that of a tester environment in which the main test is performed; and (c) determining the test condition based on the first device characteristic value and the second device characteristic value.

With such an embodiment, by measuring the first device characteristic value and the second device characteristic value, such an arrangement is capable of determining the test conditions with high precision. Furthermore, by performing the main test using the test conditions determined by the condition setting unit, such an arrangement is capable of reducing divergence in the test results of the user environment and the tester environment.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1A:
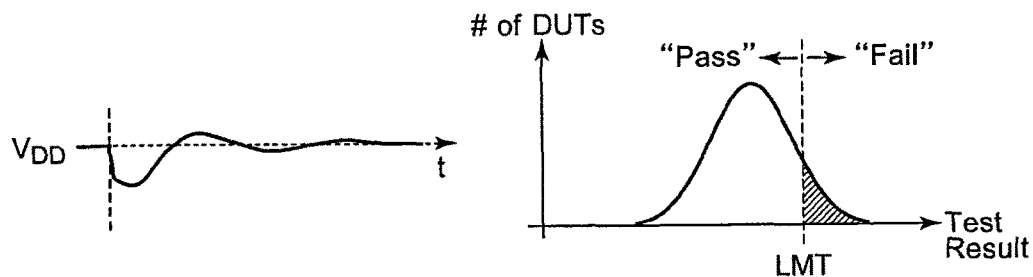
FIGS. 1A through 1C are diagrams for describing the divergence in the test results.
Figure 1B:
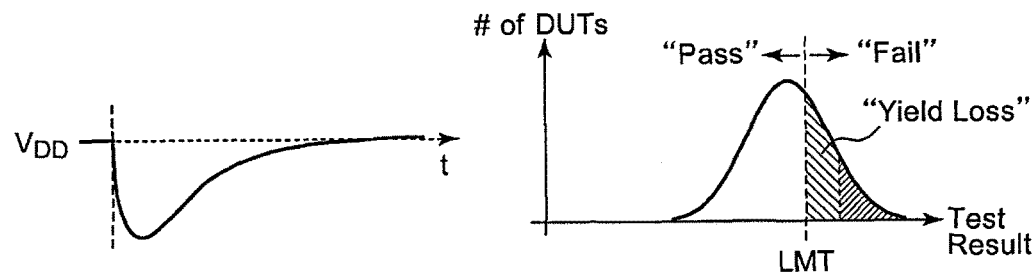
Figure 1C:
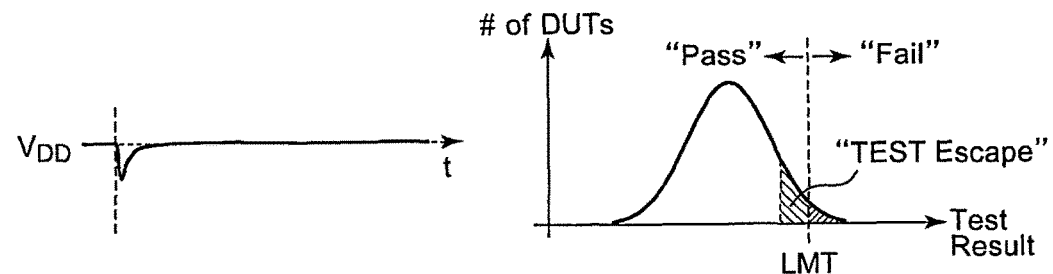
Figure 2:
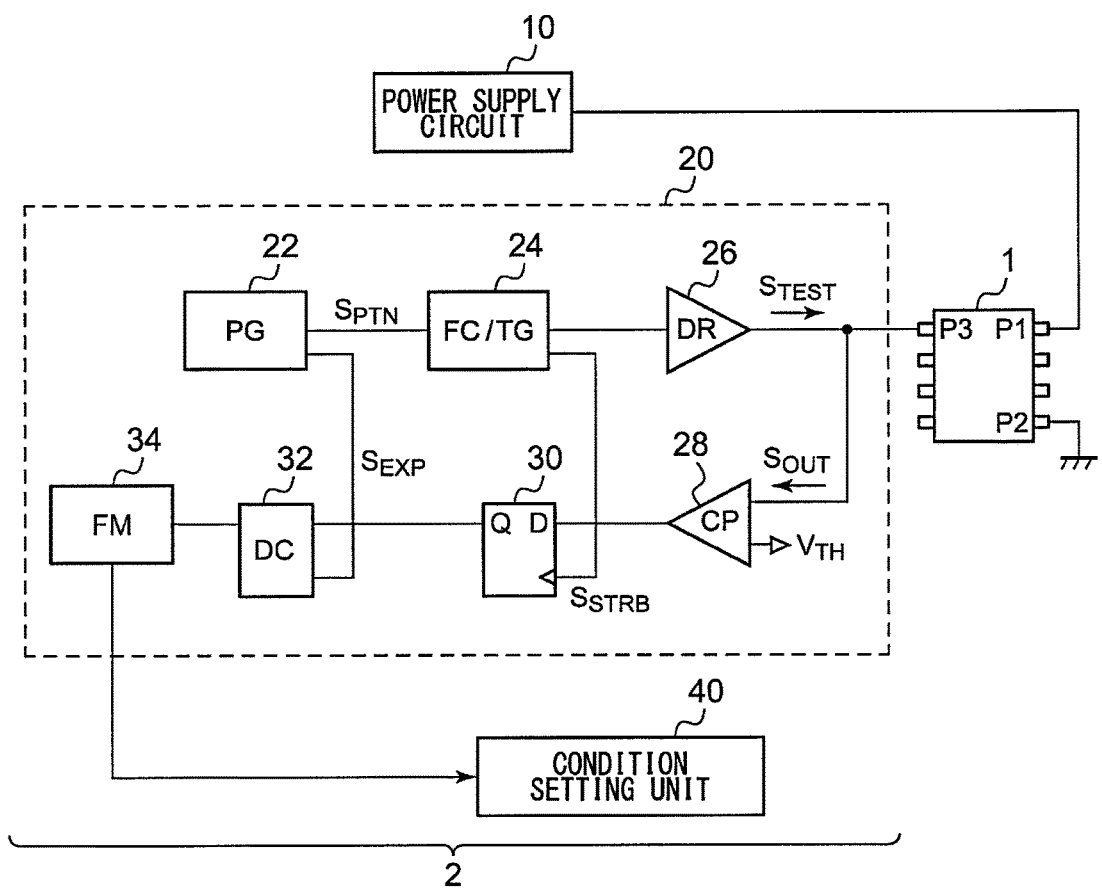
FIG. 2 is a block diagram showing a configuration of a test apparatus according to an embodiment.

FIG. 2 is a block diagram showing a configuration of a test apparatus 2 according to an embodiment. The test apparatus 2 includes a power supply circuit 10, a judgment unit 20, and a condition setting unit 40.

A DUT 1 includes multiple pins. At least one of the multiple pins is a power supply terminal P1 configured to receive the power supply voltage $V_{DD}$. At least one of the other pins is configured as a ground terminal P2. Multiple input/output (I/O) terminals P3 are each arranged in order to receive data from an external circuit, and/or to output data to an external circuit. In the test operation, via the input/output terminals, the DUT 1 is configured to receive a test signal (test pattern) $S_{TEST}$ output from the test apparatus 2, and/or to output data that corresponds to the test signal $S_{TEST}$ to the test apparatus 2.

The judgment unit 20 is configured to supply the test pattern $S_{TEST}$ to the DUT 1, to receive the data $S_{OUT}$ output from the DUT 1 in response to the test pattern $S_{TEST}$, and to compare the data $S_{OUT}$ thus received with an expected value, so as to judge the quality of the DUT 1, or so as to identify a defect position and a defect mode.

The judgment unit 20 includes a pattern generator 22, a timing generator/format controller 24, a driver 26, a comparator 28, a latch 30, a digital comparator 32, and a fail memory 34. It should be noted that FIG. 2 shows only a single channel configuration. However, the number of channels of an actual test apparatus is on the order of several hundreds to several thousands.

The pattern generator 22 is configured to generate a pattern signal $S_{PTN}$ which represents the test pattern $S_{TEST}$ to be supplied to the DUT 1, and an expected value signal $S_{EXP}$. The timing generator 24 is configured to generate a timing signal and a strobe signal $S_{STRB}$. The waveform shaper 24 is configured to adjust the edge timing of the pattern signal according to the timing signal, and to control the signal format (RZ or NRZ) of the pattern signal. The driver 26 is configured to receive the pattern signal shaped by the waveform shaper 24, and to output the pattern signal thus received as the test pattern $S_{TEST}$.

The comparator 28 is configured to compare the signal $S_{OUT}$ from the DUT 1 with a threshold voltage $V_{TH}$, and to judge the level of the signal $S_{OUT}$. The latch 30 is configured to latch the output of the comparator 28 at a timing of the strobe signal $S_{STRB}$. The digital comparator 32 is configured to compare the output of the latch 30 with the expected value signal $S_{EXP}$. The digital comparator 32 is configured to generate a pass/fail signal which indicates "pass" when the two signals match each other, and which indicates "fail" when the two signals do not match. The fail memory 34 is configured to store the pass/fail result output from the digital comparator 32.

It should be noted that the configuration of the judgment unit 20 is not restricted in particular. Rather, the judgment unit 20 may have another configuration.

The power supply circuit 10 is configured to supply a power supply signal to the DUT 1. The power supply signal is configured as a DC voltage (power supply voltage $V_{DD}$) having a stabilized voltage level, or otherwise as a DC current (power supply current $I_{DD}$) having a stabilized current value.

The configuration of the test apparatus 2 described above is the same as that of a typical test apparatus.

As described above, there is a difference in the power integrity between the user environment and the tester environment, which leads to a problem. That is to say, this leads to divergence in the test results. Specifically, this leads to yield loss (overkill) or undesired test escape (underkill).

Description will be made below regarding a configuration of the test apparatus 2 configured to solve the problem of divergence in the test results.

In order to solve the problem of divergence in the test results, a main test, and a pilot test which is performed before the main test, are performed. In the present specification, the main test represents a test which is performed in mass production in which the number of DUTs 1 to be subjected to quality judgment is on the order of several thousands or several tens of thousands.

On the other hand, the pilot test is performed before the main test for the DUTs 1. In the pilot test, several to several tens, or otherwise several hundreds, of samples (which will be referred to as "pilot samples") are randomly sampled from among the multiple DUTs 1, and only the DUTs 1 thus randomly sampled are tested.

The pilot test is executed by the test apparatus 2 shown in FIG. 2. Thus, the test apparatus 2 shown in FIG. 2 will also be referred to as the "pilot tester" hereafter. On the other hand, it is not necessary to perform the main test using the same test apparatus 2 as shown in FIG. 2. That is to say, the main test is performed by means of multiple different test apparatuses. The test apparatuses prepared in order to perform the main test will be referred to as the "main tester" hereafter.

The condition setting unit 40 is configured to acquire the test conditions to be set for the main tester in the main test based on the test result obtained in the pilot test executed before the main test for the DUT 1. By performing the main test of the DUT 1 by means of the main tester using the test conditions acquired by the condition setting unit 40, such an arrangement solves the problem of divergence in the test results.

(Theory)

It is known that variation occurs in device characteristics due to process variation in device manufacturing or the like. For example, it is known that, due to process variation, variation occurs in the propagation delay in a circuit manufactured using the CMOS technology. Also, with regard to analog circuits such as amplifiers, mixers, and so forth, such process variation leads to variation in the gain and variation in the distortion characteristics.

Such variation leads to an undesired device characteristic value that exceeds a limit value (threshold value) occurring in some of the devices. Such devices cannot operate normally, and they are judged to be "defective devices". Description will be made below with reference to an example in which defective devices occur due to variation in the propagation delay, for simplification of description and ease of understanding.

Figure 3A:
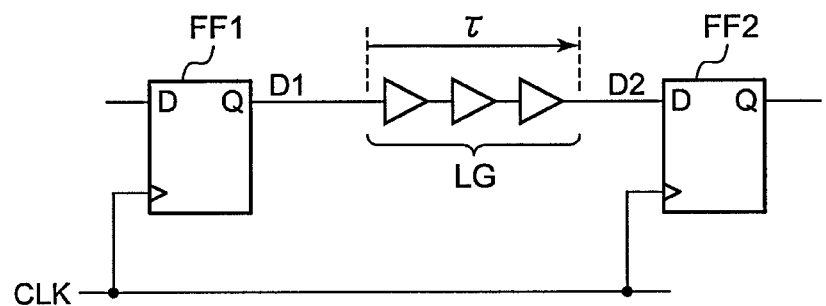
FIG. 3A is a circuit diagram showing a configuration of a digital circuit.
Figure 3B:
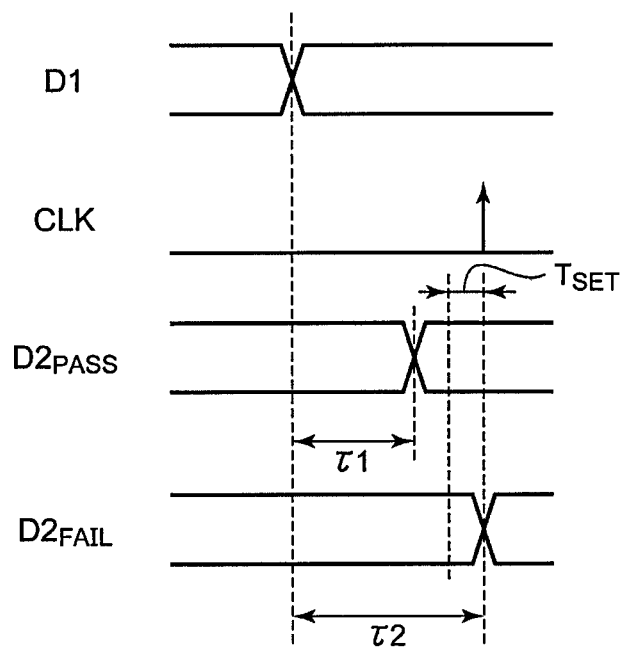
FIG. 3B is a time chart for describing its operation.

FIG. 3A is a circuit diagram showing the configuration of a digital circuit. FIG. 3B is a time chart for describing the operation of the digital circuit. Digital circuits such as combinational circuits, sequential circuits, etc., are each configured as a combination of flip-flops FF and logical gates LG. The combination having the most severe timing constraints will be referred to as the "critical path".

A digital signal (binary bit stream) output from a given flip-flop (or latch) FF1 reaches the next flip-flop FF2 via several gate elements LG. The flip-flops FF1 and FF2 are each configured to latch the input signal in synchronization with a clock signal CLK having a predetermined frequency.

FIG. 3B shows an output signal D1 of the flip-flop FF1, the clock signal CLK, and input signals $D2_{PASS}$ and $D2_{FAIL}$ of the flip-flop FF2.

The output signal D1 of the flip-flop FF1 reaches the input terminal of the flip-flop FF2 with a propagation delay $\tau$ due to the logical gates LG. However, variation occurs in the propagation delay $\tau$ for each device due to process variation. In order for the device to operate normally, there is a need to set the value of the input signal D2 of the flip-flop FF2 in at least a setup period $T_{SET}$ which is earlier than the edge timing of the clock CLK. This condition will be referred to as the "timing condition".

A device having a short propagation delay $\tau$ satisfies the timing condition. Thus, such a device operates normally. In contrast, with a device having a long propagation delay $\tau$, timing error occurs, leading to the device not operating normally.

As described above, the pass/fail result obtained in the function verification test for a digital circuit relates to the propagation delay of the internal component of the digital circuit. That is to say, it can be understood that devices having a propagation delay that is greater than a certain upper limit LMT are judged as "fail", and devices having a propagation delay that is smaller than the upper limit LMT are judged as "pass".

The present inventor prepared a first power supply circuit and a second power supply circuit having different characteristics. Furthermore, the present inventor measured the propagation delay that occurred in the internal component of each of the multiple DUTs 1 when a power supply signal was supplied to the DUTs 1 from the first power supply circuit, and when a power supply signal was supplied to the DUTs 1 from the second power supply circuit. The first power supply circuit corresponds to the power supply circuit (ATE PS) in the tester environment. The second power supply circuit corresponds to the power supply circuit (USR_PS) in the user environment.

Figure 4A:
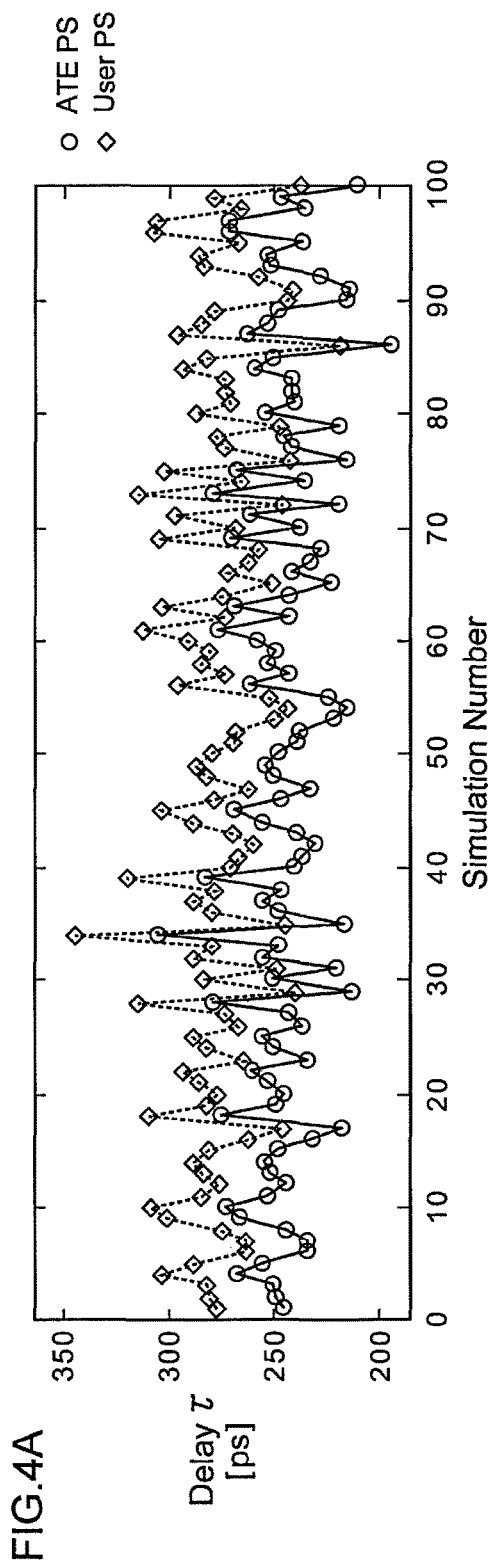
FIG. 4A is a diagram showing propagation delay measured for 100 sample devices in the tester environment and in the user environment.
Figure 4B:
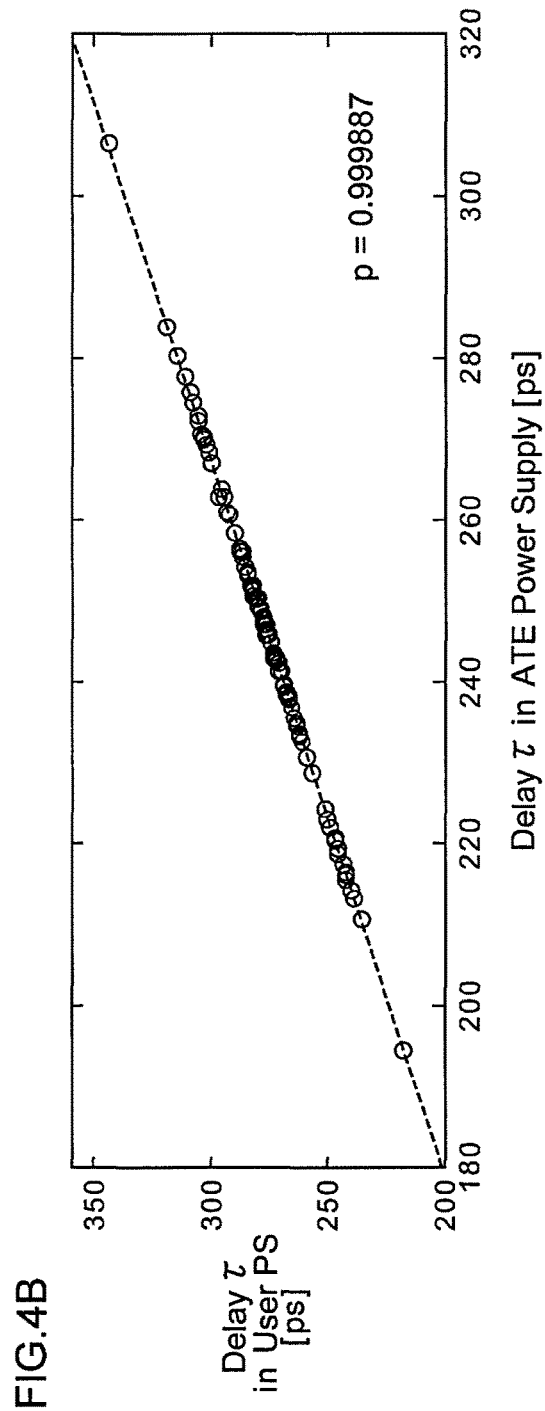
FIG. 4B is a diagram showing the relation between the propagation delay in the tester environment and the propagation delay in the user environment.

FIG. 4A is a diagram showing the propagation delay data measured for 100 sample devices in the tester environment and the user environment. FIG. 4B is a diagram showing the relation between the propagation delay measured in the tester environment and the propagation delay measured in the user environment. As shown in FIG. 4B, there is a strong correlation (correlation coefficient $\rho=0.999887$) between the propagation delay in the tester environment and the propagation delay in the user environment even if the characteristics of the power supply circuits differ, i.e., even if the variation in the waveform of the power supply signal differs. It should be noted that the above-described recognition is by no means within the scope of common and general knowledge of those skilled in this art. Furthermore, it can be said that the present inventor has been the first to arrive at this recognition after investigation.

Figure 5A:
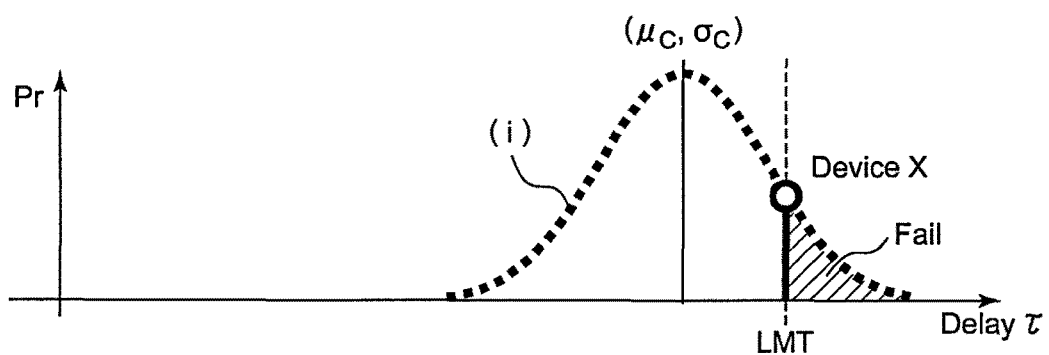
FIG. 5A is a histogram (probability density distribution) (i) of the propagation delay in the user environment.
Figure 5B:
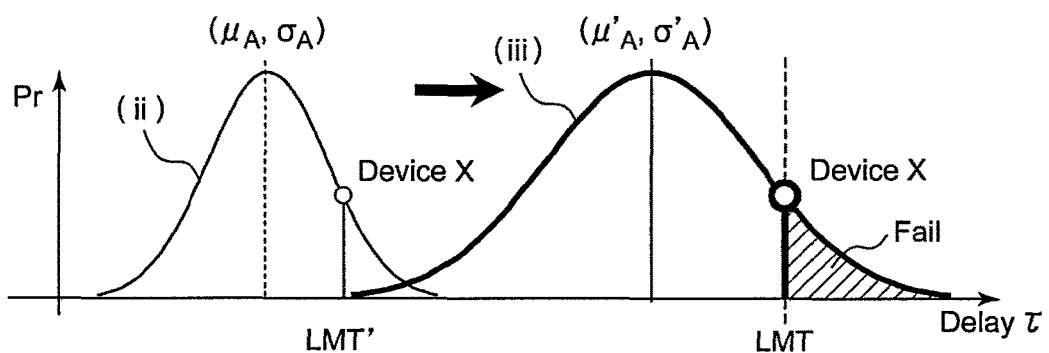
FIG. 5B is a histogram (ii) of the propagation delay in the tester environment.

FIG. 5A is a histogram (probability density distribution) (i) for the propagation delay data measured in the user environment. FIG. 5B is a histogram (ii) for the propagation delay data measured in the tester environment. Although there is a difference in the average value $\rho$ and the dispersion $\sigma$ of the propagation delay distribution thus measured between the user environment and the tester environment, there is a strong correlation between the two propagation delay distributions. Thus, the shapes of the histograms of the two propagation delay distributions are similar to each other.

Description will be made directing attention to the device X having a propagation delay that is equal to the upper limit LMT in the user environment. With the propagation delay of the device X measured in the tester environment as LMT', the multiple devices with a propagation delay measured in the tester environment that is greater than LMT' correspond to the multiple devices with a propagation delay measured in the user environment that is greater than the upper limit LMT. If there is a strong correlation between them, the number of these devices will match.

Thus, as shown in FIG. 5B, if the histogram (ii) can be transformed such that the propagation delay LMT' of the device X measured in the tester environment can be shifted to the original upper limit LMT as represented by the histogram (iii) by changing the average value and the dispersion of the histogram while maintaining its shape, i.e., while maintaining the similarity with the histogram (i), the same test result as that obtained in the user environment can be obtained in the tester environment.

With the present embodiment, in order to shift the histogram (ii) to the histogram (iii), the test conditions set for the main test are optimized. Examples of such test conditions include the power supply voltage to be supplied to the DUT 1 in the main test, the setting value of the power supply voltage, the device operation frequency, the device temperature, and the like.

The above is the theory of the method for solving the problem of divergence in the test results. Next, description will be made regarding the optimization of the test conditions.

Returning to FIG. 2, description will be made. The power supply circuit 10 shown in FIG. 2 is configured such that its characteristics can be changed. Specifically, the power supply circuit 10 is configured to be capable of emulating the characteristics of a desired power supply circuit. Such a power supply circuit 10 can be provided using the technique disclosed in Patent document 2 proposed by the present inventor. Such an arrangement is capable of emulating, in the pilot test, the power integrity in the user environment and the power integrity in the tester environment.

The condition setting unit 40 is configured to perform the pilot test, and to acquire the test conditions to be used in the main test. The condition setting unit 40 is configured to execute the following processing (a) through (c).

(a) The condition setting unit 40 measures the first device characteristic value of each of the multiple pilot sample devices sampled from among the DUTs 1, in a state that is close to the power supply characteristics in the user environment in which the DUT 1 is actually used, i.e., in a state obtained by emulating the user environment.

With the present embodiment, as the first device characteristic value, the lower limit value $V_{DD,MIN\_USR}$ of the power supply signal is employed, which is the lower limit of the power supply signal which allows the DUT 1 to operate normally when it is operated at a rated frequency.

First, the DUT 1 is operated at a rated frequency. Next, the setting value of the power supply signal (which will be referred to as the "power supply voltage" $V_{DD}$ hereafter) is changed. When the power supply voltage $V_{DD}$ becomes lower than a certain threshold value (lower limit), the device cannot operate normally. The lower limit of the power supply signal varies due to process variation. Thus, there is a difference between devices in the lower limit of the power supply signal.

Specifically, for each of the multiple pilot sample devices, the condition setting unit 40 judges the pass/fail result for each level while changing the level of the power supply voltage $V_{DD}$ in a state in which the operation frequency is fixed. With such an arrangement, the lower limit $V_{DD,MIN\_USR}$ is measured based on the pass/fail boundary.

(b) The condition setting unit 40 measures a predetermined second device characteristic value of each of the multiple pilot sample devices sampled from among the DUTs in a state that is close to the power supply characteristics in the tester environment in which the main test is performed. With the present embodiment, as the second device characteristic value, the lower limit value $V_{DD,MIN\_ATE}$ of the power supply signal is employed, which is the lower limit of the power supply signal which allows the DUT 1 to operate normally when it is operated at a rated frequency, as with the first device characteristic value.

(c) The condition setting unit 40 determines the test conditions based on the first device characteristic value and the second device characteristic value measured for each of the multiple pilot sample devices.

More specifically, in Step (c), the condition setting unit 40 may execute the following processing (c-1) and (c-2).

(c-1) The condition setting unit 40 obtains the relation between the first device characteristic value $V_{DD,MIN\_USR}$ and the second device characteristic value $V_{DD,MIN\_ATE}$.

Figure 6:
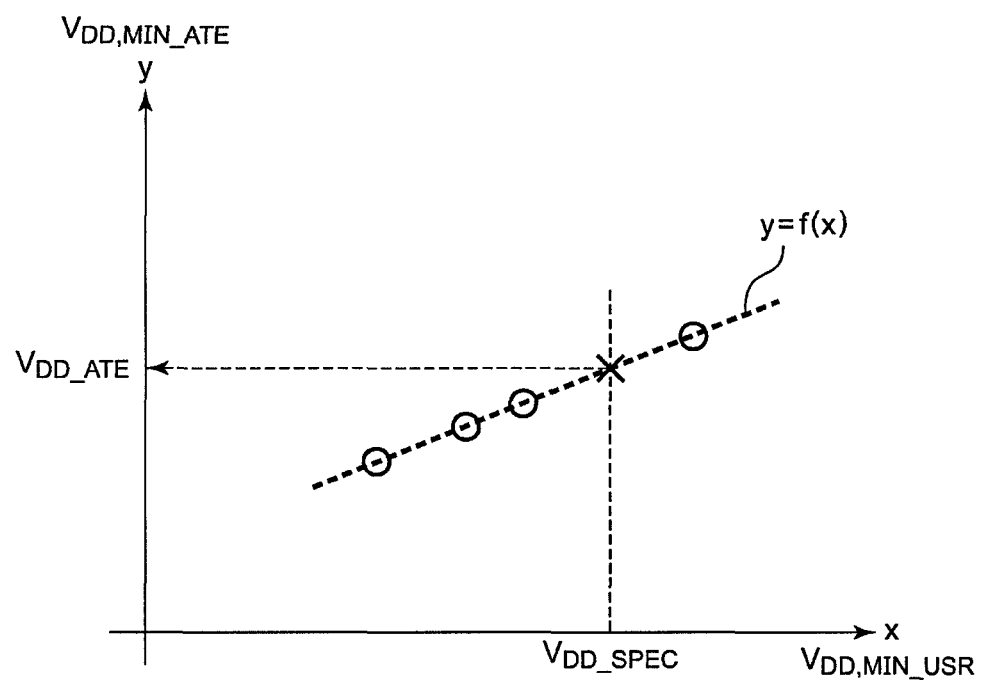
FIG. 6 is a diagram showing the relation between the first device characteristic value and the second device characteristic value.

FIG. 6 is a diagram showing the relation between the first device characteristic value $V_{DD,MIN\_USR}$ and the second device characteristic value $V_{DD,MIN\_ATE}$. FIG. 6 shows an example in which four pilot sample devices are used. The condition setting unit 40 may be configured to calculate the relation expression $y=f(x)$ with $V_{DD,MIN\_USR}$ as the variable x and with $V_{DD,MIN\_ATE}$ as the variable y. The function expression $f(x)$ may be calculated by polynomial interpolation, cubic spline interpolation, least square fitting, or the like.

(c-2) The condition setting unit 40 calculates the value $V_{DD\_ATE}$ of the corresponding second device characteristic value $V_{DD,MIN\_ATE}$ based on the spec value $V_{DD\_SPEC}$ determined beforehand for the first device characteristic value $V_{DD,MIN\_USR}$.

Specifically, the value $V_{DD\_ATE}$ can be calculated using the function expression $y=f(x)$ obtained by the condition setting unit 40. That is to say, the value $V_{DD\_ATE}$ is set to $f(V_{DD\_SPEC})$.

In a case in which the number of pilot sample devices is sufficiently great, it is not entirely necessary to obtain the relation expression $f(x)$. In this case, an arrangement may be made in which the sample device having the first characteristic value that is closest to the spec value $V_{DD\_SPEC}$ is selected, and the second characteristic value of the sample thus selected is used as the value $V_{DD\_ATE}$.

By changing the setting value of the power supply voltage $V_{DD}$ to be used in the tester environment to the value $V_{DD\_ATE}$ calculated by the condition setting unit 40 based on the spec value $V_{DD\_SPEC}$ determined for the user environment, such an arrangement is capable of shifting the histogram (ii) to the histogram (iii) as shown in FIG. 5B. This can be explained as follows. That is to say, reduction in the device power supply voltage $V_{DD}$ leads to a reduction in the operation speed of the transistors included in the CMOS circuit, resulting in an increased propagation delay.

Figure 7A:
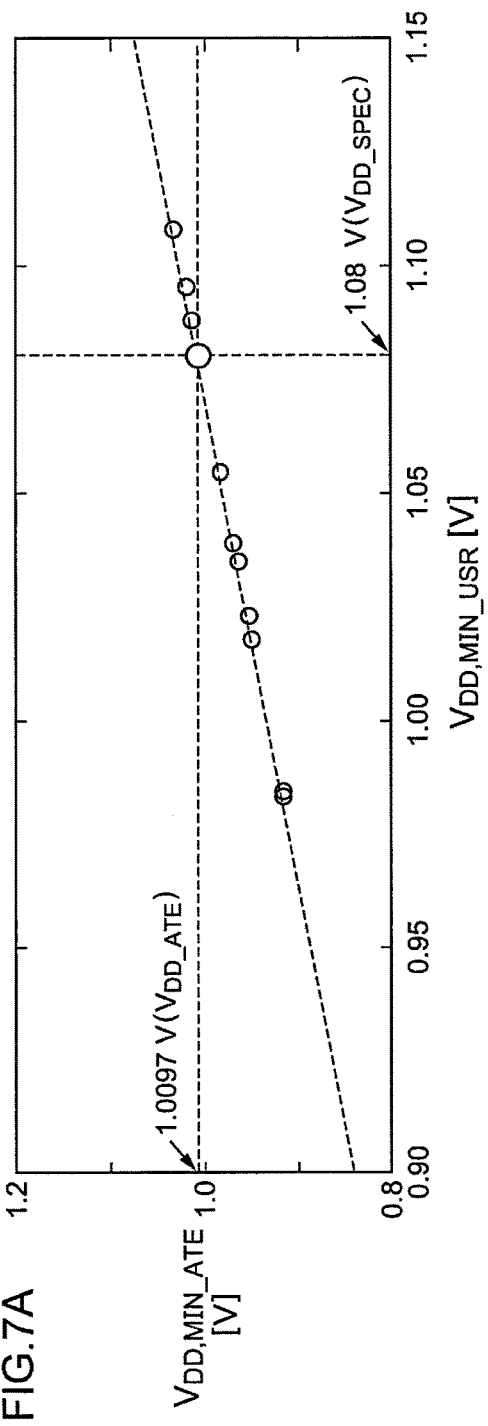
FIG. 7A is a diagram showing the first device characteristic value and the second device characteristic value measured for multiple pilot sample devices.

FIG. 7A is a diagram showing the first characteristic value $V_{DD,MIN\_USR}$ and the second characteristic value $V_{DD,MIN\_ATE}$ measured for the multiple pilot sample devices. It will be understood that there is a strong correlation between the two.

Here, in a case in which the specifications of the DUT 1 are determined so as to guarantee normal operation with the power supply voltage $V_{DD}=1.1$ V±2%, the spec value $V_{DD\_SPEC}$ is determined to be $1.1 \times 0.98 \approx 1.08$ V. The second device characteristic value $V_{DD,MIN\_ATE}$ that corresponds to the spec value 1.08 V is 1.0097 V.

The condition setting unit 40 is configured to determine the test conditions based on the value $V_{DD\_ATE}$. Specifically, in the main test, the condition setting unit 40 sets the setting value (target value) of the power supply voltage $V_{DD}$ to the value $V_{DD\_ATE}=1.0097$ V.

Figure 7B:
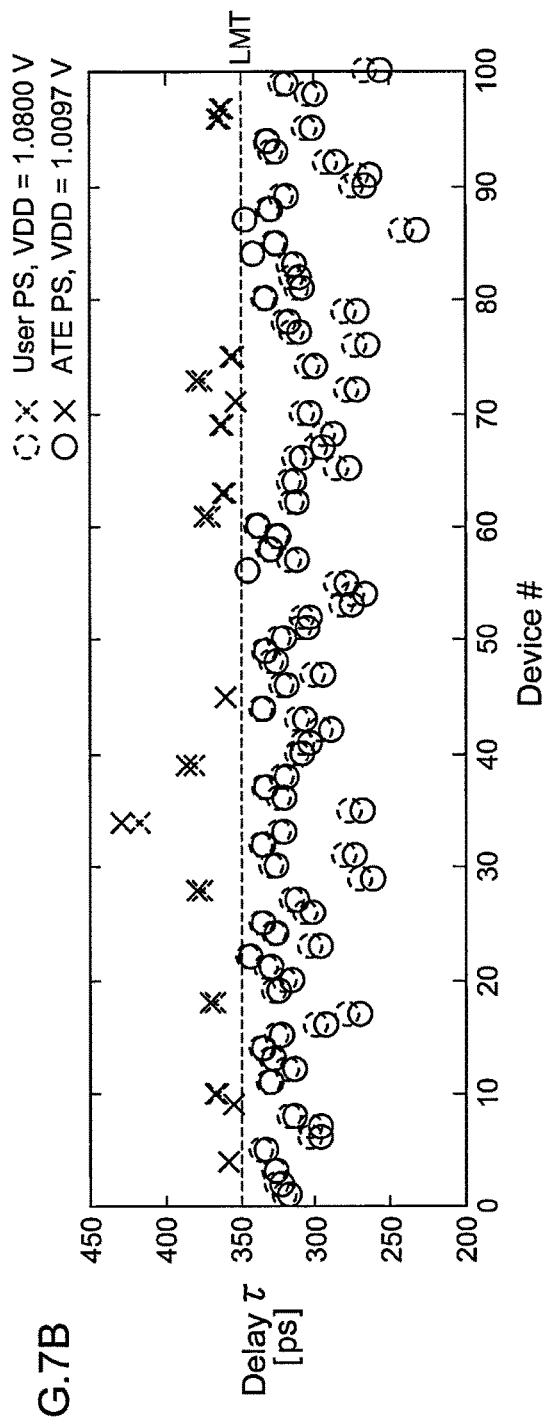
FIG. 7B is a diagram showing the propagation delay measured for 100 sample devices.

FIG. 7B is a diagram showing the propagation delay measured for 100 sample devices. FIG. 7B shows the propagation delay data measured in a case in which the setting value of the power supply voltage $V_{DD}$ is set to the $V_{DD\_SPEC}$ in the user environment (the solid line), and the propagation delay data measured in a case in which the setting value of the power supply voltage $V_{DD}$ is set to the $V_{DD\_ATE}$ in the tester environment (the broken line).

In FIG. 7B, a device having a delay that is smaller than the upper limit LMT is represented by an open circle, and a device having a delay that is greater than the upper limit LMT is represented by an "X". As can be clearly understood from FIG. 7B, by optimizing the test conditions to be set for the main test, and specifically by setting the setting value of the power supply voltage $V_{DD}$ to be used in the tester environment to the value $V_{DD\_ATE}$ calculated by the condition setting unit 40, such an arrangement allows the upper limit LMT in the tester environment, which is to be set for the histogram of the propagation delay distribution measured in the tester environment, to match the upper limit in the user environment.

The above is the acquisition of the test conditions by means of the condition setting unit 40.

Next, description will be made regarding the main test. The main test is performed using a main tester that differs from the test apparatus 2 shown in FIG. 2.

The main tester may have the same configuration as that of the test apparatus 2 shown in FIG. 2 except that the main tester does not include the condition setting unit 40 and/or the power supply circuit 10 does not have the emulating function.

In the main test operation, the setting value of the power supply voltage $V_{DD}$, which is to be generated by the power supply circuit 10, is set to the value $V_{DD\_ATE}$ determined by the condition setting unit 40. In this state, the main tester is configured to perform quality judgment for a great number of DUTs 1. It should be noted that, in the main test, the device characteristic value itself is not measured, and the function verification test is performed.

With the test apparatus 2, such an arrangement is capable of solving the problem of divergence in the test results between the user environment and the tester environment. Thus, such an arrangement suppresses overkill and yield loss.

Furthermore, in mass production, multiple main testers are used. Such multiple main testers may be configured to have different power supply circuit characteristics. In this case, in the same way as described above, one or otherwise several of the pilot testers is/are prepared including a power supply circuit having variable power supply characteristics. Furthermore, the power supply environments (tester environments) provided by the multiple main testers may each be emulated by the pilot tester thus prepared so as to determine the test conditions for each main tester.

Another advantage of the test apparatus 2 according to the embodiment is clearly understood in comparison with comparison techniques.

[Comparison Technique 1]

In order to solve the problem of divergence in the test results, another approach is conceivable in which passes/fails are counted in the tester environment and passes/fails are counted in the user environment, and the test conditions are estimated such that the test results obtained in these two environments statistically match each other. However, with such a comparison technique 1, in order to determine the test conditions with high precision, there is a need to acquire the quality judgment results for a great number (on the order of several tens of thousands) of devices under test.

In contrast with the comparison technique 1, with the test apparatus 2 according to the embodiment, such an arrangement is required to measure only several to several hundreds of pilot sample devices to determine the test conditions with high precision.

If the test conditions are determined using the comparison technique 1 based on the quality judgment results obtained for a small number of devices under test, such an arrangement provides the test conditions with poor precision. Thus, such an arrangement cannot improve the divergence in the test results (overkill and underkill). In this situation, because defective devices must not be shipped, there is a need to set the test conditions to more severe values than the test conditions determined using the comparison technique 1. This leads to increased overkill (yield loss). With the test apparatus 2 according to the embodiment, such an arrangement is capable of estimating suitable test conditions with high precision, thereby further reducing divergence in the test results as compared with the comparison technique 1.

[Comparison Technique 2]

Also, in order to solve the problem of divergence in the test results, yet another approach is conceivable in which the main testers each include a power supply circuit having variable power supply characteristics, and are each configured to emulate the power supply characteristics in the user environment. However, currently popular testers in widespread use do not mount such a power supply circuit. It is unrealistic from the cost viewpoint for the power supply circuits of all main testers to be replaced by power supply circuits having variable power supply characteristics. With the present embodiment, it is sufficient for there to be at least one pilot tester including a power supply circuit which is capable of emulating desired power supply characteristics. Thus, such an arrangement is capable of reducing divergence in the test results, with a low cost.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Description has been made in the embodiment regarding an arrangement in which the lower limit value of the power supply voltage is employed as the first characteristic value and the second characteristic value. However, the present invention is not restricted to such an arrangement.

With the first modification, as the first characteristic value, the propagation delay $\tau_{USR}$ of a predetermined path (e.g., the critical path) in the DUT 1 in the user environment is employed. Furthermore, as the second characteristic value, the lower limit value $V_{DD,MIN\_ATE}$ of the power supply signal in the tester environment is employed.

The measurement method for the propagation delay $\tau_{USR}$ is not restricted in particular. For example, the propagation delay may be measured according to the following procedure.

That is to say, the quality of the DUT 1 is judged for each operation frequency while sweeping the operation frequency of the DUT 1. With such a test, the upper limit of the frequency that allows the DUT 1 to operate normally is obtained. The reciprocal of the upper limit of the operation frequency can be considered to be approximately the same as the propagation delay $\tau_{USR}$ of the critical path.

Figure 8:
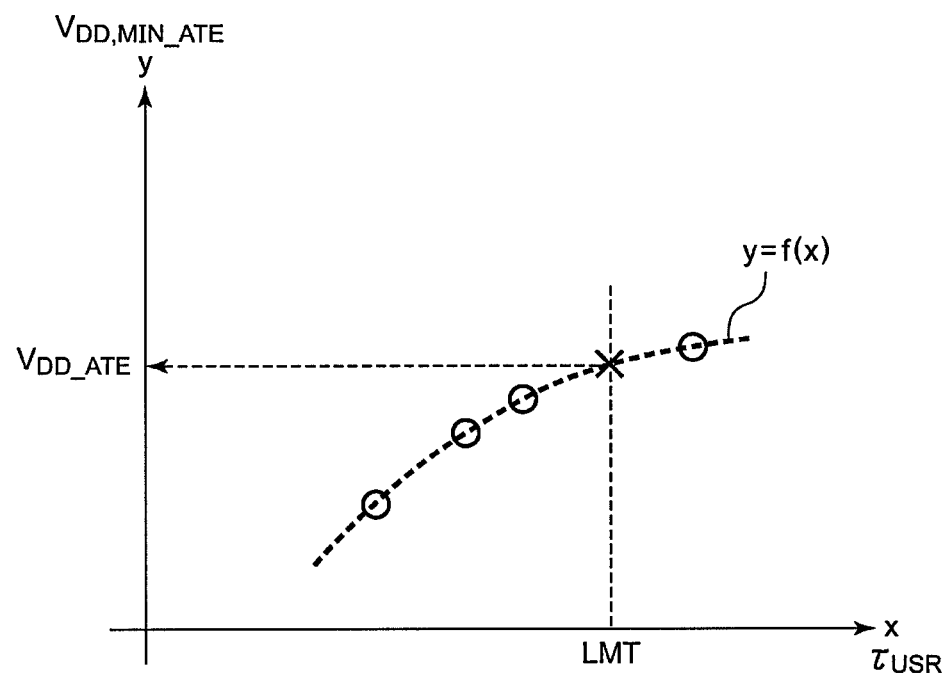
FIG. 8 is a diagram showing the relation between the first device characteristic value and the second device characteristic value according to a first modification.

FIG. 8 is a diagram showing the relation between the first device characteristic value $\tau_{USR}$ and the second device characteristic value $V_{DD,MIN\_ATE}$. The spec value $X_{SPEC}$ determined for the first device characteristic value $\tau_{USR}$ is the upper limit LMT of the propagation delay that allows the DUT 1 to operate normally.

With the first device characteristic value $\tau_{USR}$ as x and with the second device characteristic value $V_{DD,MIN\_ATE}$ as y, when the relation y=f(x) holds true, the condition setting unit 40 sets the value of the power supply voltage $V_{DD}$ used in the main test to $V_{DD\_ATE}$=f(LMT).

Such a modification also reduces divergence in the test results.

[Second Modification]

With the second modification, as the first device characteristic value and the second device characteristic value, the upper limit of the operation frequency that allows the DUT 1 to operate normally when a rated power supply signal is supplied to the DUT 1 is employed.

In this case, the spec value $X_{SPEC}$ is determined based on the rated operation frequency of the DUT 1. For example, in a case in which the DUT 1 is configured as a device guaranteed to operate at 1 GHz, the spec value $X_{SPEC}$ is determined to be 1 GHz.

Figure 9:
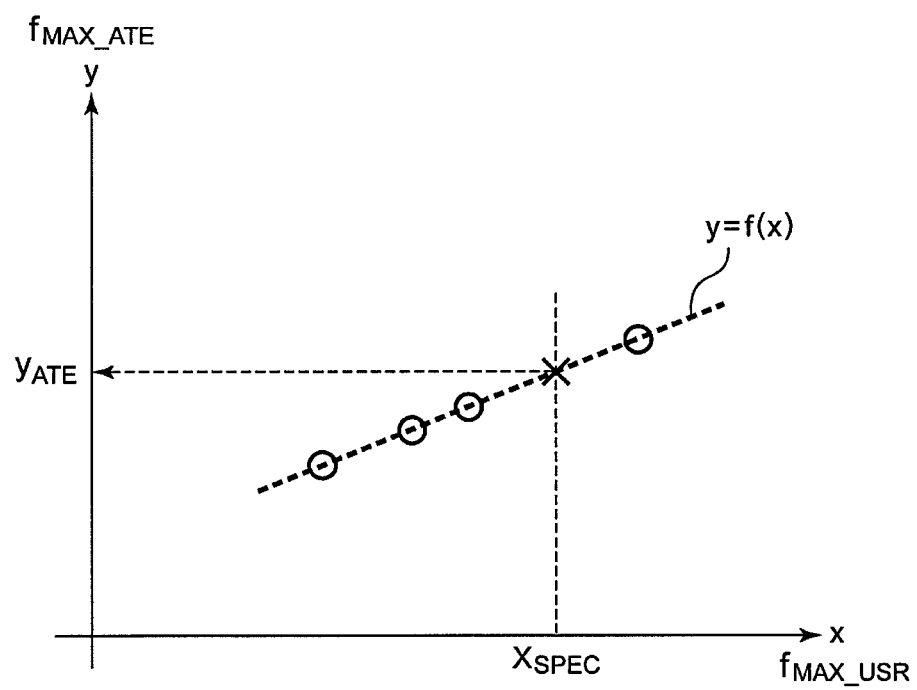
FIG. 9 is a diagram showing the relation between the first device characteristic value and the second device characteristic value according to a second modification.

FIG. 9 is a diagram showing the relation between the first device characteristic value $f_{MAX\_USR}$ and the second device characteristic value $f_{MAX\_ATE}$ according to the second modification. With the first device characteristic value $f_{MAX\_USR}$ as x and with the second device characteristic value $f_{MAX\_ATE}$ as y, when the relation y=f(x) holds true, the condition setting unit 40 sets the operation frequency of the DUT 1 to be used in the main test to $y_{ATE}$=f($X_{SPEC}$). Such a modification also reduces divergence in the test results.

[Third Modification]

As the first device characteristic value, the lower limit value $V_{DD,MIN\_USR}$ of the power supply signal that allows the DUT 1 to operate normally when the DUT 1 is operated at a rated operation frequency is employed. Furthermore, as the second device characteristic value, the upper limit value $f_{MAX\_ATE}$ of the operation frequency that allows the DUT 1 to operate normally when a rated power supply signal is supplied to the DUT 1 is employed. The spec value $X_{SPEC}$ is determined based on the rated value of the power supply signal. With the first device characteristic value $V_{DD,MIN\_USR}$ as x and with the second device characteristic value $f_{MAX\_ATE}$ as y, when the relation y=f(x) holds true, the condition setting unit 40 sets the operation frequency, at which the DUT 1 is operated in the main test, to $y_{ATE}$=f($X_{SPEC}$).

Such a modification also reduces divergence in the test results.

[Fourth Modification]

As the first device characteristic value, the upper limit value $f_{MAX\_USR}$ of the operation frequency that allows the DUT 1 to operate normally when a rated power supply signal is supplied to the DUT 1 is employed. Furthermore, as the second device characteristic value, the lower limit value $V_{DD,MIN\_ATE}$ of the power supply signal that allows the DUT 1 to operate normally when it is operated at the rated frequency is employed. The spec value $X_{SPEC}$ is determined based on the rated operation frequency of the DUT 1. With the first device characteristic value $f_{MAX\_USR}$ as x and with the second device characteristic value $V_{DD,MIN\_ATE}$ as y, when the relation y=f(x) holds true, the condition setting unit 40 sets the setting value of the power supply signal, which is to be supplied to the DUT 1 in the main test, to $Y_{ATE}$=f($X_{SPEC}$).

Embracing the embodiment and the first through the fourth modifications, the following technical concept can be derived.

The first device characteristic value and the second device characteristic value may be configured as a desired combination of the following characteristic values (i) through (iv).

(i) The lower limit value $V_{DD,MIN}$ of the power supply signal that allows the DUT 1 to operate normally when the DUT 1 is operated at the rated frequency.

(ii) The propagation delay τ of a predetermined path of the DUT 1 that occurs when the rated power supply signal is supplied to the DUT 1.

(iii) The upper limit value $f_{MAX}$ (of the operation frequency that allows the DUT 1 to operate normally when the rated power supply signal is supplied to the DUT 1.

Description has been made above assuming that the temperature is maintained at a constant value. However, the propagation delay τ also changes according to a change in the temperature. Thus, the temperature may be selected as the first characteristic value or the second characteristic value.

(iv) The upper limit value or the lower limit value of the temperature that allows the DUT 1 to operate normally when a rated power supply signal is supplied to the DUT 1 and when the DUT 1 is operated at a rated frequency.

Description has been made above directing attention to the defect mode caused by the propagation delay. However, the present invention is not restricted to such an arrangement. Rather, the present invention can be applied to various kinds of semiconductor device tests.

For example, the DUT 1 may be configured as an analog amplifier, mixer, or the like. In this case, examples of the first characteristic value and the second characteristic value also include the power supply voltage, temperature, the cutoff frequency ft or the maximum oscillation frequency $f_{MAX}$ of a transistor element, the input voltage amplitude, the input voltage range, and the like.

Also, the DUT 1 may be configured as a light receiving element such as a CCD (Charged Coupled Device), CMOS sensor, or the like. As the unique characteristic value of such a light receiving element, the input light amount may be employed.

Description has been made in the embodiment regarding an arrangement in which the power supply circuit 10 is configured to emulate the power supply characteristics in the user environment and in the tester environment when the first device characteristic value and the second device characteristic value are measured. However, the present invention is not restricted to such an arrangement. For example, in the user environment, the first device characteristic value may be actually measured for the multiple pilot sample devices. In addition to or instead of the measurement of the first device characteristic value, the second device characteristic value may be actually measured for the multiple pilot sample devices in the tester environment. In this case, the condition setting unit 40, which is configured to set the conditions of the power supply circuit 10, may preferably execute the processing (c).

While the preferred embodiments of the present invention have been described using specific terms, such description is for illustrative purposes only, and it is to be understood that changes and variations may be made without departing from the spirit or scope of the appended claims.

What is claimed is:

1. A test apparatus configured to test a device under test, the test apparatus comprising:
   a judgment unit configured to judge a pass/fail of the device under test;
   a power supply circuit configured to allow a characteristic thereof to be changed, and to supply a power supply signal to the device under test; and
   a condition setting unit configured to perform a pilot test before a main test for the device under test, and to determine a value of the power supply signal to be supplied to the device under test in the main test,
   wherein the condition setting unit is configured to execute:
   (a) measuring a first device characteristic value for each of a plurality of pilot sample devices sampled from the devices under test in a state in which a characteristic of the power supply circuit is emulated such that the characteristic of the power supply circuit is close to a power supply characteristic in a user environment in which the device under test is actually used;
   (b) measuring a second device characteristic value for each of the plurality of pilot sample devices in a state in which a characteristic of the power supply circuit is emulated such that the characteristic of the power supply circuit is close to that of a tester environment in which the main test is performed; and
   (c) determining the value of the power supply signal used in the main test based on the first device characteristic value and the second device characteristic value,
      wherein the second device characteristic value represents a lower limit value of the power supply signal that allows the device under test to operate normally when the device under test is operated at a rated frequency.

2. The test apparatus according to claim 1, wherein, in the aforementioned step (c), the condition setting unit is configured to perform:
   (c-1) obtaining a relation between the first device characteristic value and the second device characteristic value; and
   (c-2) based on the relation, acquiring the second device characteristic value that corresponds to a spec value $X_{SPEC}$ determined for the first device characteristic value; and
   (c-3) setting the value of the power supply signal used in the main test to the acquired second device characteristic value.

3. The test apparatus according to claim 1, wherein the first device characteristic value represents a lower limit value of a power supply signal that allows the device under test to operate normally when the device under test is operated at a rated frequency.

4. The test apparatus according to claim 3, wherein a spec value $X_{SPEC}$ is determined based on a rated value of the power supply signal,
   and wherein, with the first device characteristic value as a variable x and with the second device characteristic value as a variable y, when the second device characteristic value is represented by a function y=f(x), the value of the power supply signal used in the main test is set to $y_{ATE}=f(X_{SPEC})$.

5. The test apparatus according to claim 1, wherein the first device characteristic value represents a propagation delay of a predetermined path of the device under test when a rated power supply signal is supplied to the device under test.

6. The test apparatus according to claim 5, wherein the spec value $X_{SPEC}$ is determined based on an upper limit value of the propagation delay that allows the device under test to operate normally,
   and wherein, with the first device characteristic value as a variable x and with the second device characteristic value as a variable y, when the second device characteristic value is represented by a function y=f(x), the value of the power supply signal used in the main test is set to $y_{ATE}=f(X_{SPEC})$.

7. The test apparatus according to claim 1, wherein the first device characteristic value represents an upper limit value of an operation frequency that allows the device under test to operate normally when a rated power supply signal is supplied to the device under test.

8. The test apparatus according to claim 7, wherein a spec value $X_{SPEC}$ is determined based on a rated operation frequency of the device under test,
   and wherein, with the first device characteristic value as a variable x and with the second device characteristic value as a variable y, when the second device characteristic value is represented by a function y=f(x), the value of the power supply signal used in the main test is set to $y_{ATE}=f(X_{SPEC})$.

9. The test apparatus according to claim 1, wherein the first device characteristic value represents an upper limit value or otherwise as a lower limit value of a temperature that allows the device under test to operate normally when a rated power supply signal is supplied to the device under test and when the device under test is operated at a rated frequency.

* * * * *